(12) United States Patent
Nishimura et al.

(10) Patent No.: US 6,904,086 B2
(45) Date of Patent: Jun. 7, 2005

(54) ADAPTIVE EQUALIZER CIRCUIT

(75) Inventors: Kouichirou Nishimura, Ebina (JP); Kouichi Hirose, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 804 days.

(21) Appl. No.: 09/812,694

(22) Filed: Mar. 21, 2001

(65) Prior Publication Data

US 2001/0043651 A1 Nov. 22, 2001

(30) Foreign Application Priority Data

May 11, 2000 (JP) ........................................ 2000-143398

(51) Int. Cl.$^7$ ............................ H03H 7/30; H03H 7/40; H03K 5/159
(52) U.S. Cl. ........................ 375/232; 375/229; 375/230; 375/231; 375/233; 375/234
(58) Field of Search ................................. 375/229–236; 360/65; 331/17

(56) References Cited

U.S. PATENT DOCUMENTS 5,036,296 A * 7/1991 Yoshida ........................ 331/17
5,768,313 A * 6/1998 Kuribayashi ................ 375/232
6,208,481 B1 * 3/2001 Spurbeck et al. ............ 360/65
6,414,990 B1 * 7/2002 Jonsson et al. .............. 375/232

FOREIGN PATENT DOCUMENTS

JP        09-321671        12/1997

* cited by examiner

Primary Examiner—Stephen Chin
Assistant Examiner—Curtis Odom
(74) Attorney, Agent, or Firm—McDermott Will & Emery LLP

(57) ABSTRACT

An adaptive equalizer processing an input having a fluctuating amplitude realizes a stable adaptive equalization operation without changing over a reference value for computing an equalization error. An input signal is held as a sample with a timing signal shifted from a reference clock of the input signal by a phase of ½ cycle. An equalization output is compute from sample data. The difference between only the first output value after a zero-crossing and an arbitrary reference value is computed, and the computed value is set as an equalization error. A coefficient of the adaptive equalization circuit is updated from the equalization error and the sample data. To stabilize for displacement of symmetry of the input, the reference value of the equalizer is changed corresponding to the change of a digitization threshold value of a digitization circuit which constitutes a rear stage of the adaptive equalizer.

8 Claims, 11 Drawing Sheets

ADAPTIVE EQUALIZER CIRCUIT

BACKGROUND OF THE INVENTION

1. Field of the Invention

The present invention relates to a waveform equalizer circuit of an optical information recording and regenerating apparatus which can optically record and regenerate information to a recording medium.

2. Description of the Related Art

A recording and regenerating system of an optical disc has a transmission characteristics which is called "optical transfer function (OTF)" determined by a laser wavelength and a numerical aperture of a lens in an optical pickup. This OTF has a characteristic of a kind of low pass filter. Accordingly, when the recording density of data recorded on the optical disc is increased to increase a recording capacity of the optical disc, the transmission band becomes short and hence, when neighboring marks are to be regenerated, interference between signs in which respective regenerating waveforms interfere with each other is generated. As a technique for attenuating this interference between signs, a waveform equalizer circuit which emphasizes high-band components of regenerating signals is used. However, since the optical transmission characteristics are changed depending on the relationship between the disc and a pickup, when the equalization characteristics are fixed, the interference between signs is generated due to factors such as a tilt of the disc and the regenerating signals are deteriorated. Further, since the band of the optical transmission characteristics is changed depending on the regenerating speed of the disc, in the variable-speed regeneration such as a CAV or the like, it becomes necessary to change the equalization characteristics following the regenerating speed of the disc. To solve such a problem, the waveform equalizing technique which employs an adaptive equalizer circuit is used. The adaptive equalizer circuit changes equalization characteristics corresponding to the change of the transmission characteristics in an input signal system and transmits proper signals to an output signal system.

A conventional example of the adaptive equalizer circuit is shown in FIG. 2. A sample value input 201 which is obtained by sampling reading signals 200 read by an optical disc not shown in the drawing by means of a sample hold circuit 205 is inputted to a system which is comprised of n pieces of unit delay elements D1–Dn which are connected with each other in the longitudinal direction. The unit delay elements D1–Dn have a time delay equal to a sampling period of the above-mentioned sample values and an output of one unit delay element becomes an input of one preceding sampling. In multiplication circuits MO–Mn, products of the signal 201 and the sample values outputted from respective delay elements and coefficients computed by coefficient control circuits CO–Cn are computed and the products are inputted into an addition circuit 203. An output from the addition circuit 203 is outputted as an output value 202 of the adaptive equalizer circuit and at the same time is inputted to a subtraction circuit 204. In the subtraction circuit 204, the difference between an output value Vo and an arbitrary given reference value is outputted as an adaptive error value. This reference value is determined such that the equalization characteristics of this adaptive equalizer circuit become the targeted transmission characteristics. This determination method is explained later in detail. The error value obtained by the subtraction circuit 204 is inputted to the coefficient control circuits CO–Cn. Each coefficient control circuit is constituted by a multiplication circuit and an integration circuit. For example, in the coefficient control circuit CO, the product of the input sample value 201 and the above-mentioned error value is computed by the multiplication circuit LO and the obtained value is averaged out by the integration circuit SO and is outputted to the multiplication circuit MO as a coefficient.

In this manner, by sequentially updating the coefficients of a FIR (Finite Impulse Response) filter, the adaptive equalizer circuit sets the equalization characteristics to the targeted transmission characteristics.

Subsequently, the above-mentioned reference values are explained. Here, as an input to the adaptive equalizer circuit, for example, a signal shown in FIG. 3 is considered. In this waveform, the sample value in the vicinity of a zero-crossing point indicated by numeral 301 becomes 0 when transmission characteristics are properly equalized. Accordingly, a sample which has the output Vo of the adaptive equalizer circuit in the vicinity of the zero-crossing point is extracted, and then, the difference between the above-mentioned Vo and the reference value is computed while assuming the reference value as 0, and the computed value is inputted to the coefficient control circuit as the equalizer error whereby a proper equalizer coefficient to the input waveform shown in FIG. 3 can be obtained. Further, as another technique for setting the reference value, as shown in FIG. 4, threshold values +Vth and −Vth are set and the comparison of magnitude between the output Vo of the adaptive equalizer circuit and the threshold value is performed and the reference value is changed based on the result.

For example, with respect to an example shown in FIG. 4, when the output Vo of the adaptive equalizer circuit is set to Vo<−Vth, the reference value is set to −1, when the output Vo of the adaptive equalizer circuit is set to −Vth<Vo<Vth, the reference value is set to 0, and when the output Vo of the adaptive equalizer circuit is set to Vth<Vo, the reference value is set to 1.

Due to such a constitution, it becomes possible to perform the updating of coefficients with respect to all output values of the adaptive equalizer circuit so that the extraction of the output values in the vicinity of the zero-crossing point becomes unnecessary.

The setting of these reference values and the manner of operation of the adaptive equalizer circuit are described in detail in Japanese Laid-open Publication 321671/1997.

SUMMARY OF THE INVENTION

A case in which the technique for setting the reference values of the adaptive equalizer circuit as a conventional example is applied to the regeneration of the optical disc is considered.

In a DVD-RAM disc which constitutes a recordable optical disc, address information is preliminarily recorded in regions called PID (Physical Identification Data) regions.

Since the PID regions are discontinuously present in the disc, to take the synchronicity with the reference clock, a region which is called a VFO (Variable Frequency Oscillator) section and in which signals of a single frequency are recorded is present. When the updating of the coefficients is performed using only the output values in the vicinity of the zero crossing point with respect to the waveforms regenerated in this VFO section, as shown in FIG. 5, with respect to the waveforms which differ in the amplitude of the waveform in synchronization with the data sampling period, the equalizer error computed from the data sampled in zero-crossing portions 501–505 all become 0. However, no control is performed in regions other than the zero-crossing points an innumerable number of waveforms which satisfy the above-mentioned characteristics exist as shown in FIG. 5. This implies that there exist an innumerable number of conversing points so that the characteristics of the adaptive equalizer circuit become unstable.

Further, in the optical disc, a tracking servo and a rotary servo are driven by making use of the optical characteristics of the optical disc. Accordingly, with respect to a CD, the modulation is performed such that 8 bit data is converted into 14 bit data and this becomes the repeated data of 3–11 Tw provided that 1 bit is set as the reference clock cycle 1 Tw. In the same manner, with respect to a DVD, the modulation is performed such that 8 bit data is converted into 16 bit data and this becomes the repeated data of 3–14 Tw provided that 1 bit is set as the reference clock cycle 1 Tw. Due to these modulations, it becomes possible to obviate the long continuation of the same bits made of 0 and 1 so that the tracking servo and the rotary servo can be driven in a stable manner. On the other hand, the band of the signals is broadened. Particularly, the DVD uses a portion of the band of signals in the vicinity of an upper limit of the optical transmission characteristics.

FIG. 6 shows the optical transmission characteristics with a numerical aperture of 0.6 and at the laser wavelength of 650 nm at the time of regenerating the DVD with the same fold speed. In case of the same fold speed regeneration by the DVD, the repeating frequency of 3 Tw signals having the highest frequency is 4.36 MHz and the amplitude becomes approximately 30% of the 14 Tw signal (frequency 0.96 MHz) having the lowest frequency. FIG. 7 shows an eye pattern at the time of DVD regeneration.

In performing the coefficient updating of the adaptive equalizer circuit to such a waveform at all sample values sampled at the reference clock cycle indicated by a broken line, when the threshold value Vth and the reference value are set using the 14 Tw signal as the reference, the equalization error to the 3 Tw signal becomes large and this brings about the irregularities of a group delay characteristics and the worsening of the coefficient convergence performance of the adaptive equalizer circuit due to an excessive equalization.

To cope with this phenomenon, it may be considered to provide a plurality of sets of threshold value and positive and negative reference values. However, since the estimation of the signal cycle is impossible, it becomes necessary to hold the value of the adaptive equalization output by storing means such as a memory or the like and to set the reference values while measuring the signal cycle. Accordingly, a cumbersome processing for administrating the timing of coefficient updating and the storing means such as the memory or the like becomes necessary.

To solve the above-mentioned problem, an adaptive equalizer circuit which adds given equalization characteristics to signals inputted through a transmission path and performs a control such that an equalization error obtained by performing an arithmetic operation based on an obtained output and a given reference value is minimized thus obtaining equalization characteristics, the adaptive equalizer circuit of the present invention is constituted such that an arithmetic operation is performed in synchronization with a signal having a phase different from the reference clock signal of the above-mentioned signal by a ½ clock cycle, and equalization characteristics are changed by computing an equalization error based on a first output value and the above-mentioned reference value after a sign of an output of the adaptive equalizer circuit is changed from positive to negative or from negative to positive.

Further, in the above-mentioned constitution which changes the equalization characteristics, the equalization characteristics are changed based on the first output value and the first reference value after the sign of the output of the above-mentioned adaptive equalizer circuit is changed from positive to negative, and the equalization characteristics are changed based on the first output value and the second reference value after the sign of the output of the above-mentioned adaptive equalizer circuit is changed from negative to positive.

Further, in addition to the above-mentioned changing operation of the equalization characteristics of the adaptive equalizer circuit, the adaptive equalizer circuit is constituted such that the equalization characteristics is changed based on the second reference value and the output value immediately before the sign of the output of the adaptive equalizer circuit is changed from positive to negative, and the equalization characteristics is changed based on the first reference value and output value immediately before the sign of the output of the adaptive equalizer circuit is changed from negative to positive.

Further, in the above-mentioned constitution which changes the equalization characteristics, the equalization characteristics are changed based on the first output value and the first reference value after a sign of an output of the adaptive equalizer circuit is changed from positive to negative or from negative to positive, and the equalization characteristics are changed based on the second reference value and the output value immediately before the sign of the output of the above-mentioned adaptive equalizer circuit is charmed from positive to negative or negative to positive.

Further, the above-mentioned second reference value is set to a value which inverts a sign of the above-mentioned first reference value.

Further, the above-mentioned adaptive equalizer circuit is constituted such that the adaptive equalizer circuit is operated to sample an input signal with a signal having a phase different from the reference clock signal which is in synchronization with the input signal by a ½ clock cycle, and the equalization characteristics is changed based on an output value of the adaptive equalizer circuit.

Further, the above-mentioned adaptive equalizer circuit is operated to sample an input signal with a signal having a phase different from the reference clock signal which is in synchronization with the input signal by a ½ clock cycle, and the adaptive equalizer circuit computes an output value of the adaptive equalizer circuit which is in synchronization with a signal having a phase different from the reference clock signal by a ½ clock cycle by an interpolation and changes the equalization characteristics using the computed value.

Further, the adaptive equalizer circuit is constituted such that the above-mentioned reference values are changed corresponding to the change of threshold values at the time of digitizing the output of the above-mentioned adaptive equalizer circuit.

DESCRIPTION OF THE PREFERRED EMBODIMENTS

Figure 1:
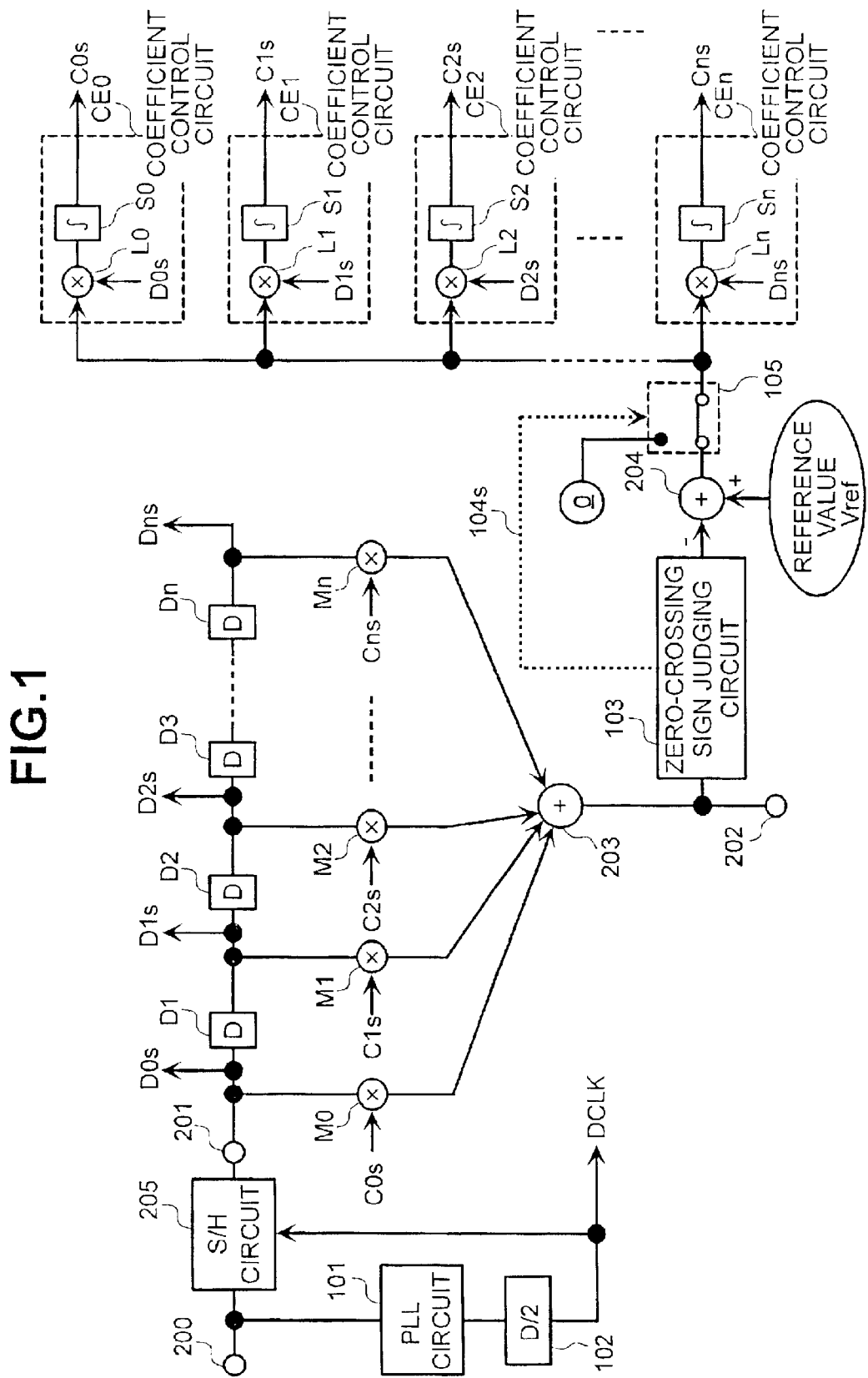
FIG. 1 is a circuit block diagram of an adaptive equalizer circuit showing a first embodiment of the present invention.

Before describing the constitution and the manner of operation of adaptive equalizer circuits of the present invention in detail in conjunction with attached drawings, symbols used in these drawings are explained.

In these drawings, numeral 101 indicates a PLL circuit, numeral 102 indicates a ½ clock cycle delay circuit, numeral 103 indicates a zero-crossing sign judging circuit, numeral 105 indicates a changeover switch, numeral 106 indicates a changeover switch, numeral 108 indicates a changeover switch, DO–Dn indicate unit clock cycle delay circuits, Dn+1 indicate 12 unit clock cycle delay circuits, DCZ indicates a unit clock cycle delay circuit, MO–Mn indicate multiplication circuits, LO–Ln indicate multiplication circuits. SO–Sn indicate integration circuits. numeral 203 indicates an addition circuit. numeral 1302 indicates an addition circuit. numeral 204 indicates a subtraction circuit. numeral 205 indicates a sample hold circuit and numeral 1301 indicates a binarization circuit.

Figure 2:
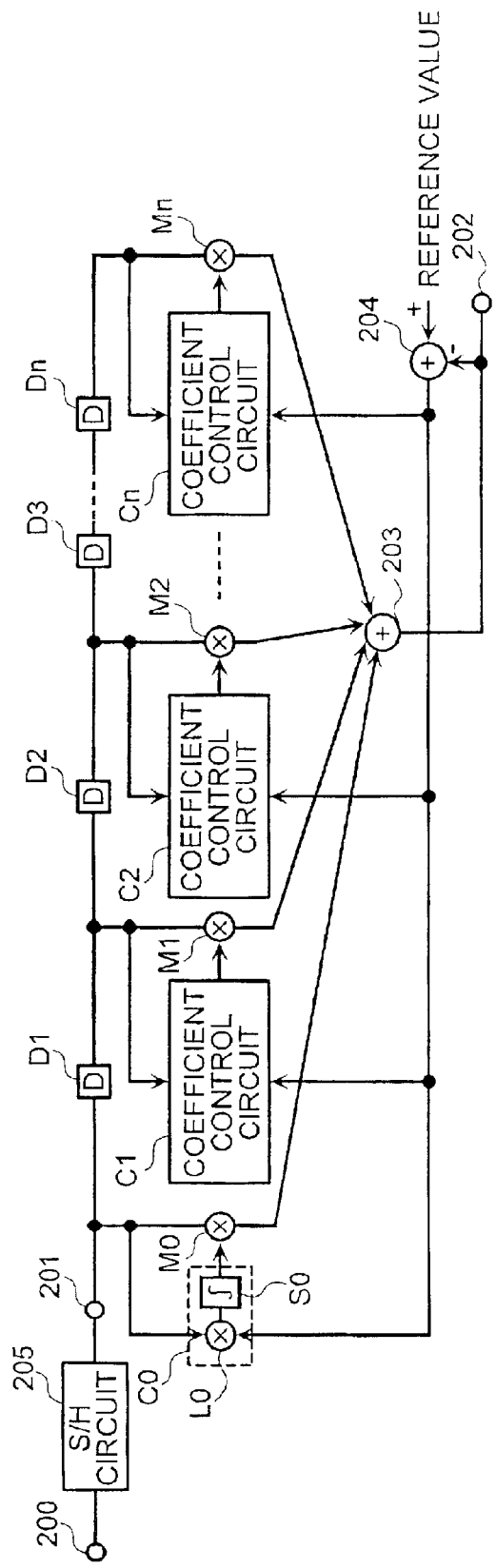
FIG. 2 is a circuit block diagram of a conventional adaptive equalizer circuit.
Figure 3:
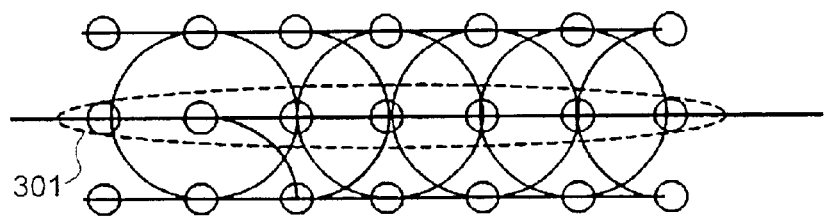
FIG. 3 is a view showing an example of waveform obtained by a transmission system.

FIG. 1 shows a block diagram of an adaptive equalizer circuit of a first embodiment of the present invention. In the drawing, blocks having the identical functions as those of FIG. 2 are given same symbols. In an operation of the circuit shown in FIG. 1, the operation of portions different from the circuit of FIG. 2 which illustrates the conventional example is explained hereinafter. A signal 200 which is regenerated from an optical disc not shown in the drawing and from which DC components are removed is inputted to the sample hold circuit 205 as in the case of the conventional example. Multiplication circuits and integration circuits including the sample hold circuit 205 are operated based on an operation timing signal DCLK.

The operation timing signal DCLK is generated from the PLL circuit 101 which is synchronized with a zero-crossing point of an input signal and a D/2 delay element 102 having a delay quantity of a ½ cycle of a clock signal obtained by the PLL circuit 101. A sample value outputted from the sample hold circuit 205 is inputted to an FIR filter constituted by delay elements D1–Dn having a delay quantity of one clock cycle and the multiplication circuits M0–Mn. Here, it is assumed that respective circuits for performing the multiplication, the integration, the addition and the subtraction have no circuit delays.

Figure 8:
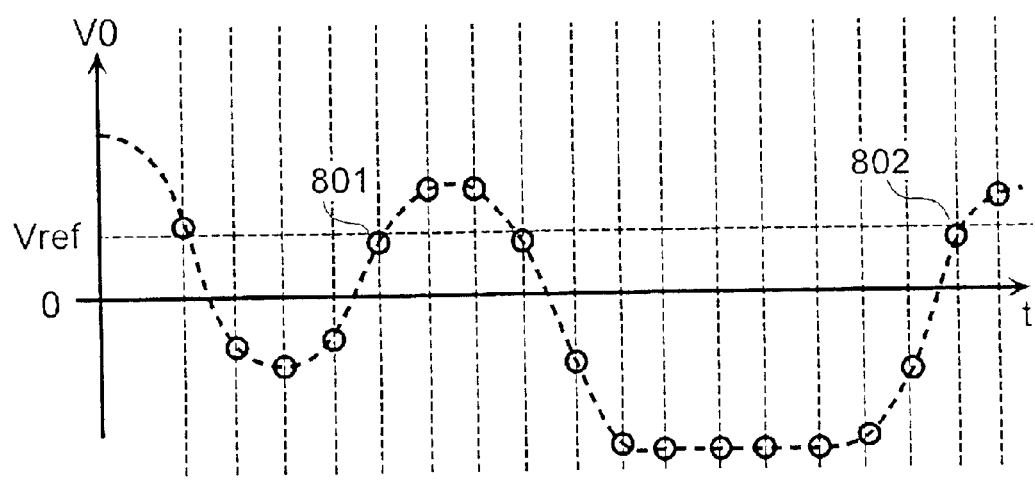
FIG. 8 is a view showing data series of adaptive equalization output in the first embodiment of the present invention.

The coefficient updating operation at the FIR filter is explained hereinafter. The switch 105 in FIG. 1 is initially set to a black dot side and 0 (zero) is inputted as the equalization error to the multiplication circuits L0–Ln of the coefficient control circuits. In this case, the outputs of the multiplication circuits L0–Ln become 0 and the output values of the integration circuits S0–Sn are not changed. Accordingly, the coefficient values C0s–Cns are not changed. FIG. 8 shows an example of data on an output from the above-mentioned FIR filter. A dashed line in FIG. 8 shows a reference clock cycle. In the waveform equalizer circuit of this embodiment, the output is computed by performing the sampling with the above-mentioned operation timing signal DCLK. Accordingly, the data series at positions indicated by white dots in FIG. 8 which are obtained with a delay of a ½ cycle relative to the reference clock are outputted from the FIR filter. The data series are inputted to the zero-crossing sign judging circuit 103. The zero-crossing sign judging circuit 103 detects the first data after the sign is changed from negative to positive in the data series and assumes these data as coefficient updating samples. In FIG. 8, the data 801 and the data 802 become the coefficient updating samples. When the coefficient updating samples are detected, the changeover switch 105 is changed over to the white-dot side in response to a control signal 104s and the equalization error computed based on the coefficient updating samples and the reference values Vref are inputted to the multiplication circuits L0–Ln of the coefficient control circuits. Accordingly, the outputs of the integration circuits S0–Sn are changed and the coefficients C0s–Cns are updated. When the coefficient updating samples are not detected, the changeover switch 105 is connected to the black-dot side so as to stop the updating of the coefficients C0s–C0n.

Figure 4:
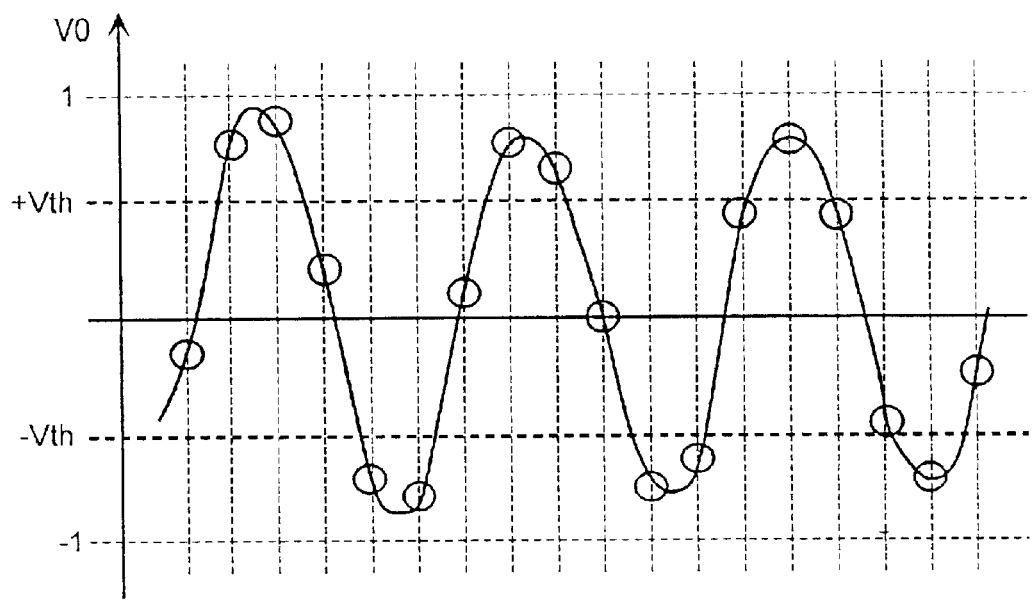
FIG. 4 is a view showing an example of an input waveform Of the adaptive equalizer circuit.
Figure 5:
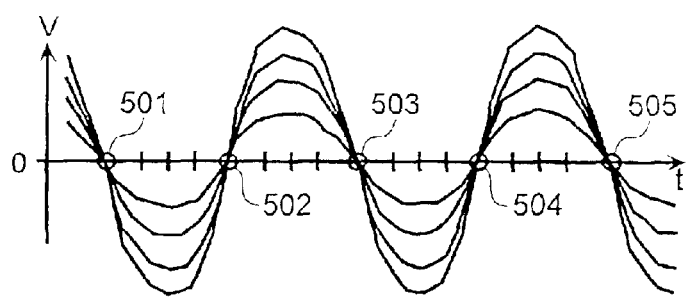
FIG. 5 is a view showing a waveform of unit cycles having different amplitudes.
Figure 6:
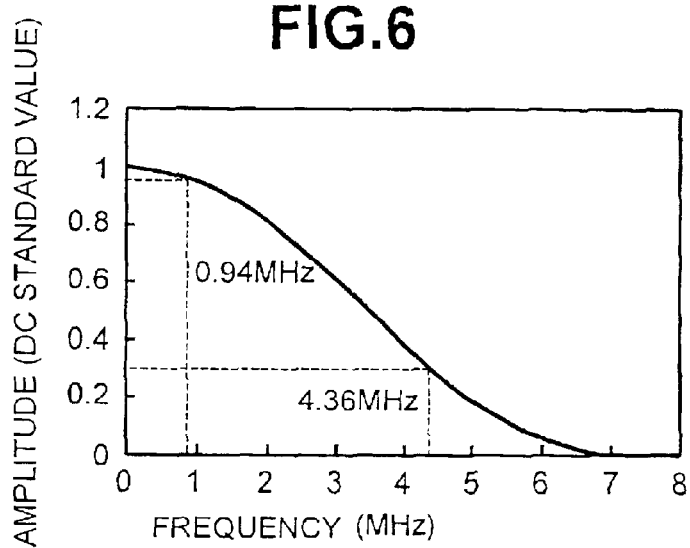
FIG. 6 is a view showing an example of optical transmission characteristics of a DVD disc.
Figure 7:
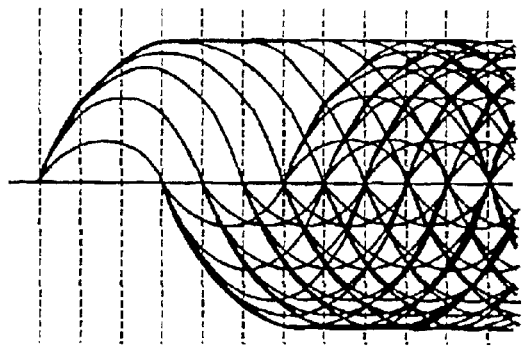
FIG. 7 is a schematic view showing a regenerating eye pattern of the DVD disc.

In such a constitution, even when the signal amplitude is changed corresponding to the signal cycle as shown in FIG. 8, since there is substantially no difference in the signal amplitude at a ½ clock cycle after the zero-crossings, the reference value Vref which is provided for computing the equalization error can be set to a fixed value so that the stable adaptive equalization can be performed even to the input signal having the amplitude fluctuation. Further, since there is no coefficient updating based on the zero-crossing data of the signals, the stable adaptive equalization can be performed on the unit frequency signal shown in FIG. 4.

Figure 9:
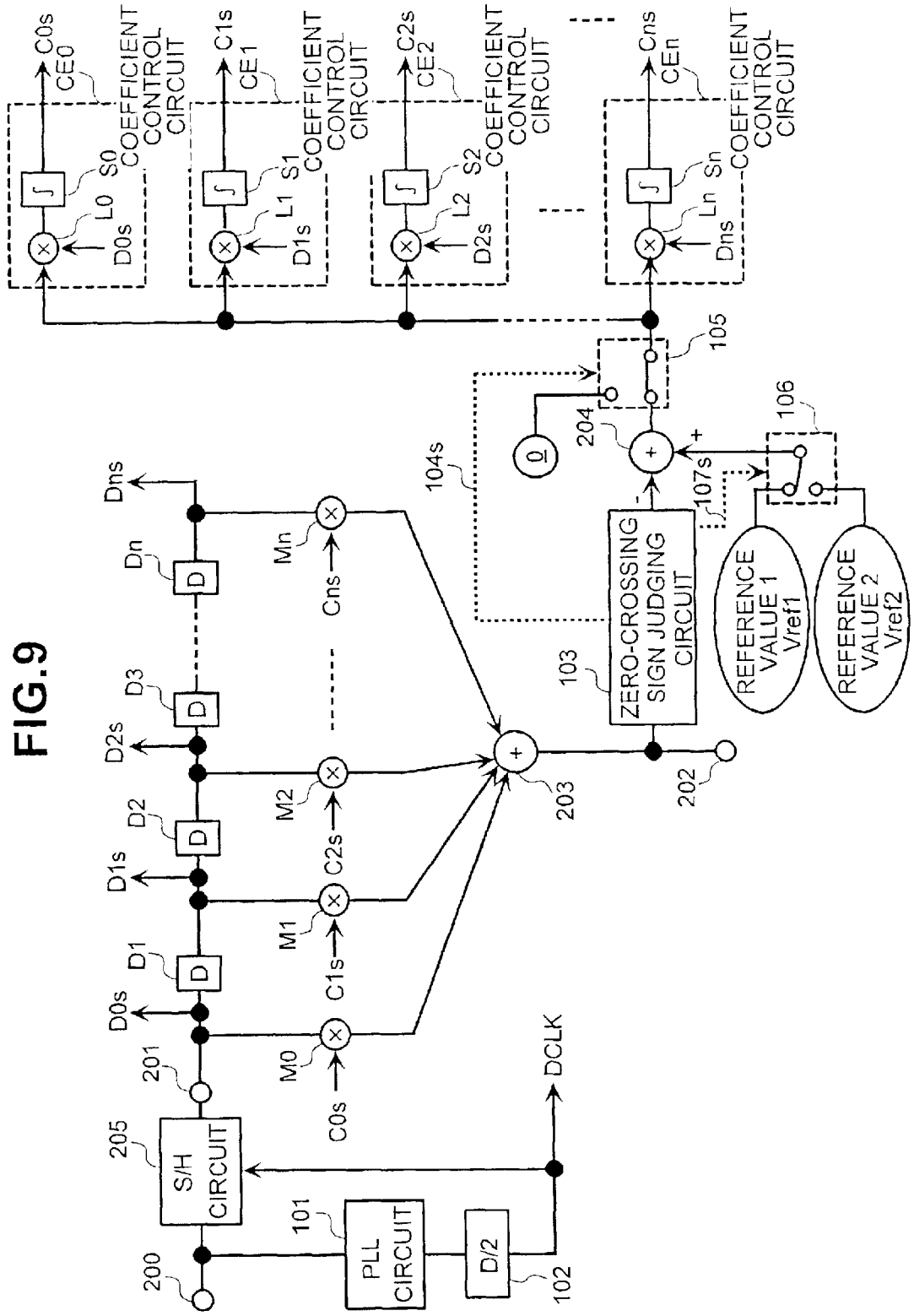
FIG. 9 is a circuit block diagram of an adaptive equalizer circuit showing a second embodiment of the present invention.

FIG. 9 shows a circuit block diagram of an adaptive equalizer circuit of a second embodiment of the present invention. In the drawing, blocks having the identical functions as those of FIG. 1 are given same symbols and their explanation is omitted.

Figure 10:
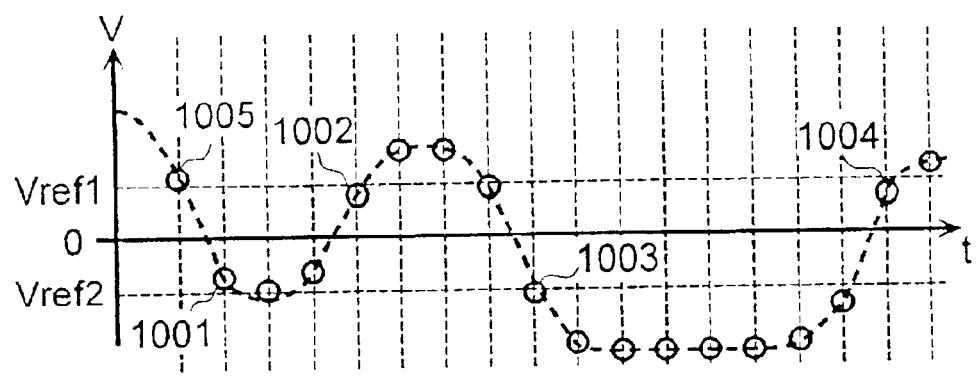
FIG. 10 is a view showing data series of adaptive equalization output in the second embodiment of the present invention.

The coefficient updating operation of the adaptive equalizer circuit of this embodiment is explained hereinafter using FIG. 10. FIG. 10 shows data series obtained at an output 202 of the adaptive equalizer circuit shown in FIG. 9. At the output 202, the white-dote data series in FIG. 10 obtained with a ½ cycle delay relative to the reference clock as in the case of the embodiment 1 can be obtained. The obtained data series are inputted to a zero-crossing sign judging circuit 103 as in the case of the embodiment 1. In the zero-crossing sign judging circuit 103, the first data after the zero-crossing in the data series are extracted as the coefficient updating sample. In FIG. 10, the data 1001–1004 become coefficient updating samples. The extracted data are respectively subjected to the sign judgement. In the sign judgement, a changeover switch 106 is controlled based on a control signal 107s such that when the sign of the extracted data is positive, the positive first reference value {Vref1>0) is selected and when the sign of the extracted data is negative, the negative second reference value {Vref2 <0) is selected. In case of FIG. 9, the second reference value Vref2 is selected at the data 1001, 1003 and 16 the first reference value Vref1 is selected at the data 1002, 1004.

Due to such a constitution, while ensuring the similar advantageous effect obtained by the embodiment 1, this embodiment can also enhance the coefficient converging performance by using all of the first data after the zero-crossing as the coefficient updating data.

Figure 11:
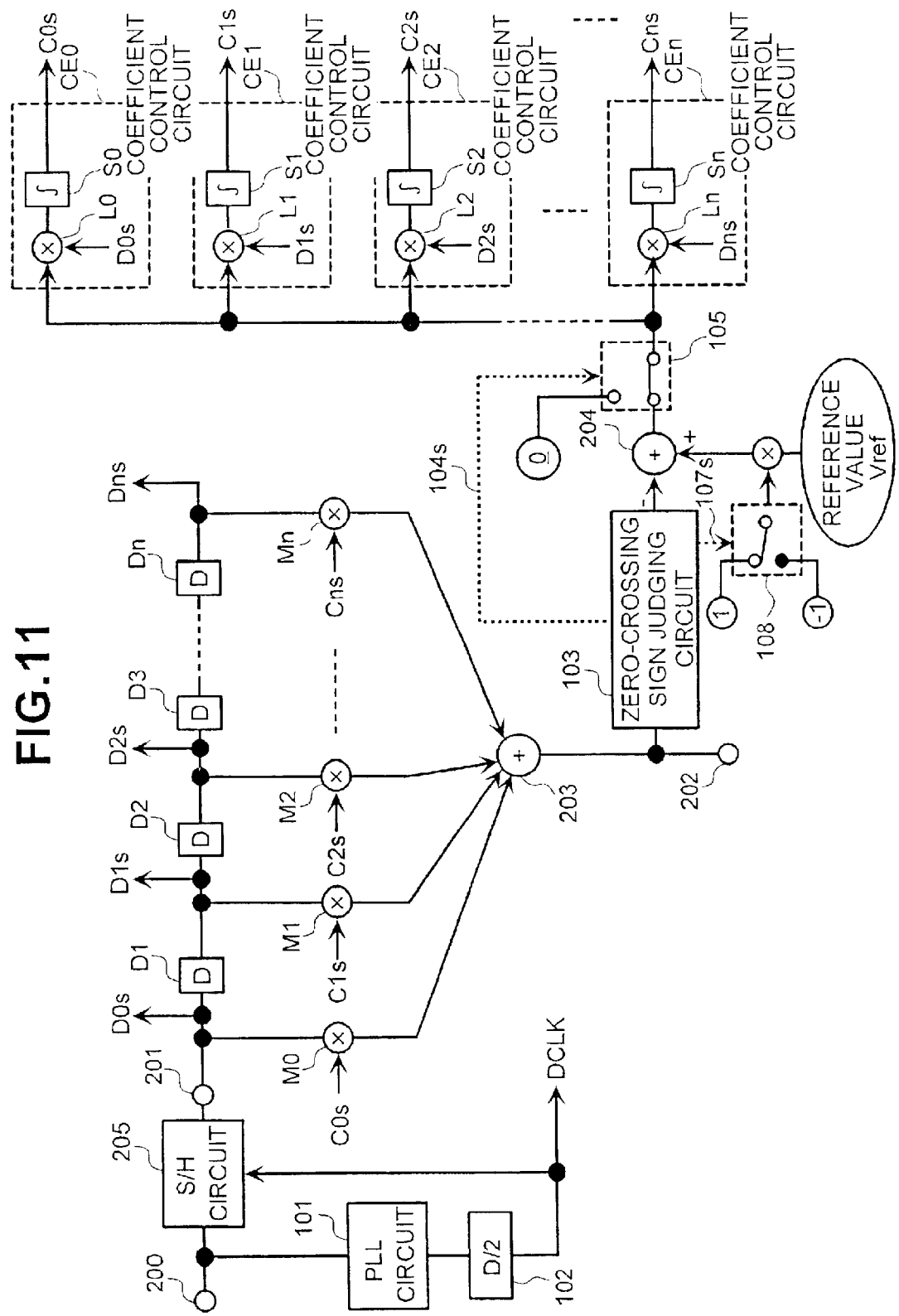
FIG. 11 is a circuit block diagram of an adaptive equalizer circuit showing a third embodiment of the present invention.

FIG. 11 shows a circuit block diagram of an adaptive equalizer circuit of a third embodiment of the present invention. In the drawing, blocks having the identical functions as those of FIG. 1 and FIG. 9 are given same symbols and their explanation is omitted.

The coefficient updating operation of the adaptive equalizer circuit of this embodiment is explained hereinafter. Data series obtained at an output 202 in the same manner as the embodiment 1 and the embodiment 2 are inputted to the zero-crossing sign judging circuit 103. In the zero-crossing sign judging circuit 103, the extraction of the coefficient updating samples and the sign judgment are performed in the same manner as the embodiment 2. As the result of the sign judgement, a changeover switch 108 is controlled based on a control signal 107s. When the result of the sign judgement is positive, the changeover switch 108 selects a white dot, that is, 1, while when the result of the sign judgement is negative, the changeover switch 108 selects a black dot, that is, –1. Due to such a constitution, without providing a plurality of reference values, an advantageous effect similar to that of the embodiment 2 can be obtained.

Figure 12:
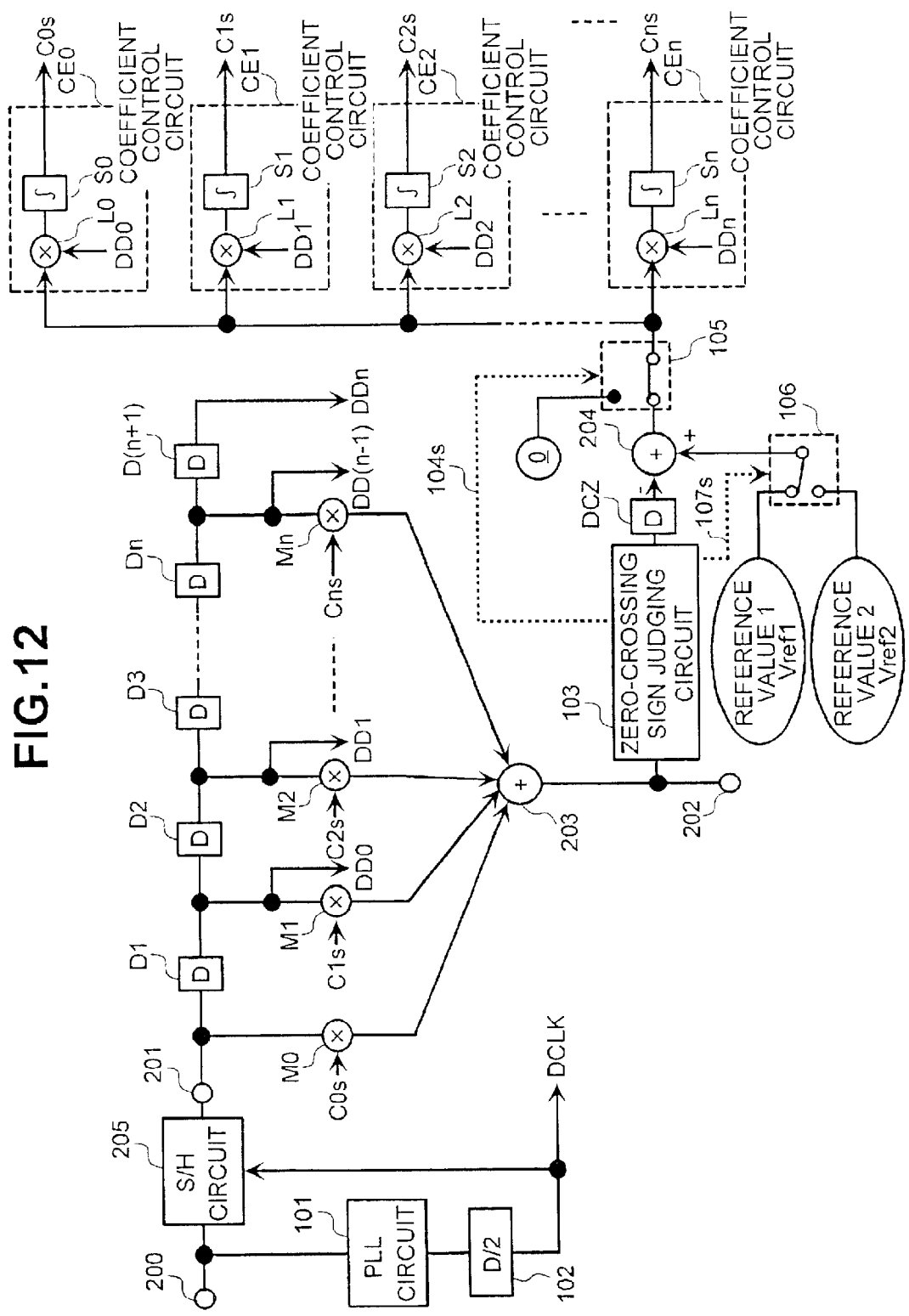
FIG. 12 is a circuit block diagram of an adaptive equalizer circuit showing a fourth embodiment of the present invention.

FIG. 12 shows a circuit block diagram of an adaptive equalizer circuit of a fourth embodiment of the present invention. In the drawing, blocks having the identical functions as those of FIG. 9 are given same symbols and their explanation is omitted. D(n+1) in the drawing indicates a unit delay element having a function similar to those of the unit delay elements D0–Dn.

The coefficient updating operation of this adaptive equalizer circuit is explained hereinafter. In the same manner as the embodiment 2, output data 202 from an FIR filter which are computed based on data sampled with a timing signal DLCK are inputted to a zero-crossing sign judging circuit 103. As an example, the operation at the time that data 1001 in FIG. 10 are extracted as the coefficient updating data after the zero-crossing in the same manner as the embodiment 2 is explained. When the data 1001 are extracted, the changeover switch 105 is selected to the white-dot side and the coefficient updating is performed. Here, although the sign of the data 1001 is judged as negative, data 1005 which precedes the data 1001 by one clock cycle by means of a unit delay circuit DCZ is inputted to the subtraction circuit 204 which computes the equalization error. Since the sign of the data 1005 is opposite to the sign of the data 1001, as the reference value, the positive first of the reference value (Vref1) which has the sign opposite to the sign of the data 1001 is selected. The equalization error computed accordingly are inputted to coefficient control circuits CE0–CEn. Here, in respective coefficient control circuits CE0–CEn, it is necessary to update the coefficients based on input sample data which are used for computing the data 1005 and the above-mentioned equalization error. Accordingly, data DD0 which delays the input data by 1 clock cycle is used for computing the coefficients C0s. The data DD0 are equal to the input data used at the time of computing the data 1005. To compute the coefficient C1s, data DD1 which delays the input data by 2 clock cycles is used. This data DD1 are equal to the data which delays the input data at the time of computing the data 1005 by 1 clock cycle. In the same manner, to compute the coefficient CnS, data DD(n+1) which delays the input data by (n+1) clock cycles is used. Accordingly, the coefficient CnS can be computed based on the n clock cycle delay data at the time of computing the data 1005 and the previously-mentioned equalization error so that the proper coefficient updating computing can be performed based on the data 1005. Subsequently, after one clock cycle, the data 1001 is inputted to the subtraction circuit 204. In synchronization with this inputting, based on the control signal 107s, the changeover switch 106 is changed over to the negative second reference value (Vref2) side which has the same sign as the data 1005. Here, while holding the changeover switch 105 to the white dot side, the coefficient updating is performed based on the data 1001. The equalization error computed based on the data 1001 and the second reference value is inputted to Here, while holding the changeover switch 105 the coefficient control circuits CE0–CEn. Here, the input sample data DD0–DDn inputted to respective coefficient control circuits CE0–CEn are turned into data delayed by one clock cycle compared to data at the time of computing data 1001 and these data are equal to data used for computing the data 1005. Accordingly, the proper coefficient updating using the data 1001 can be performed.

Due to such a constitution, although one unit delay element is to be added compared with the embodiment 2 and the embodiment 3, this embodiment can perform the coefficient updating using data before and after the zero-crossing. Accordingly, compared with the embodiments 1–3 which perform the coefficient updating using only the data after zero-crossing, this embodiment can further enhance the coefficient conversion performance while obtaining the advantageous effects similar to those of the embodiments 1–3.

Although the adaptive equalizer circuit which uses the second reference value is described in this embodiment, the constitution which controls the sign of the reference value as described in the embodiment 3 may be used.

Figure 13:
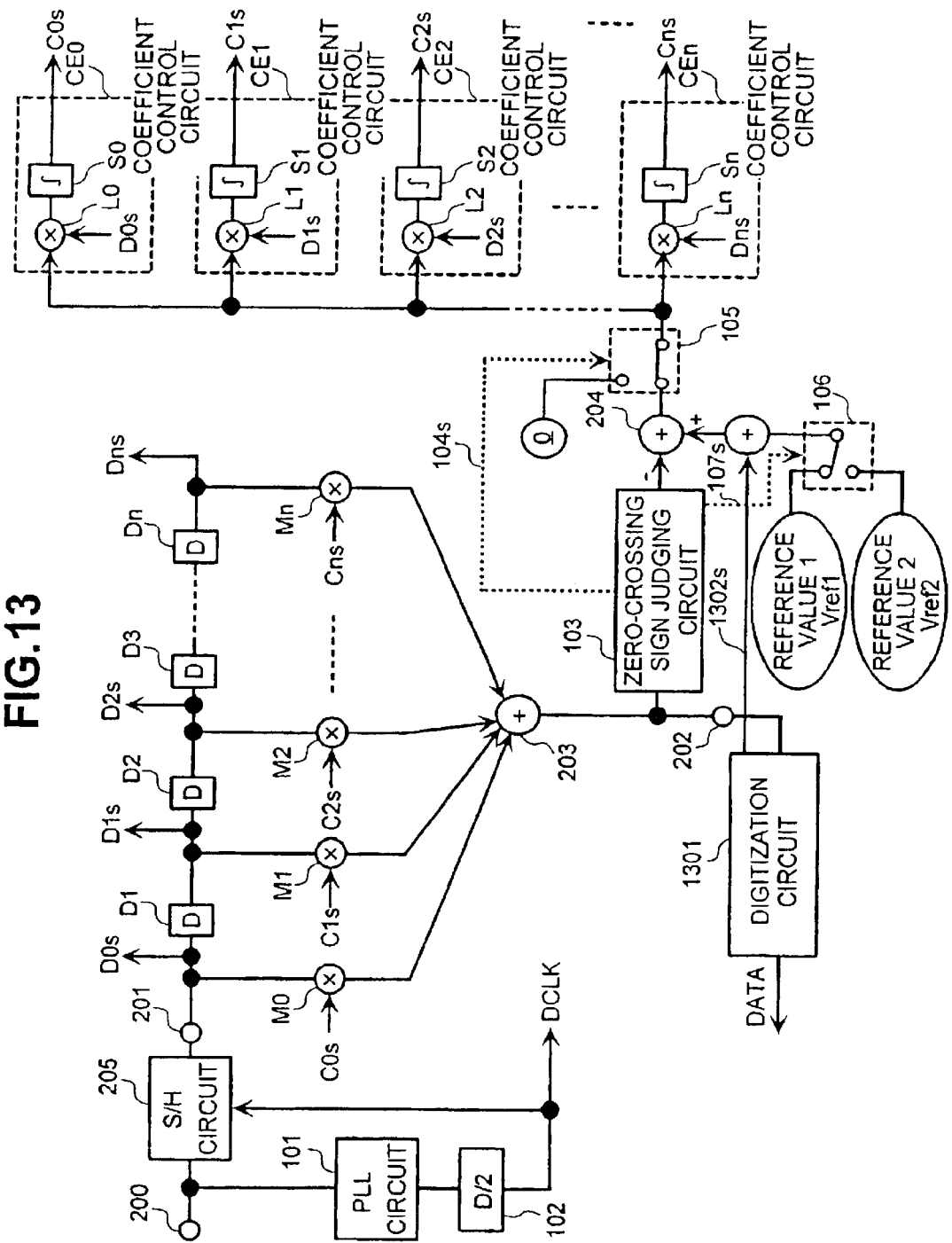
FIG. 13 is a circuit block diagram of an adaptive equalizer circuit showing a fifth embodiment of the present invention.

FIG. 13 shows a circuit block diagram of an adaptive equalizer circuit of a fifth embodiment of the present invention. In the drawing, blocks having the identical functions as those of FIG. 11 are given same symbols and their explanation is omitted. In the drawing, numeral 130 indicates a digitization circuit which digitizes the data series obtained at an output 201. In this circuit, a threshold value Vslth which is used at the time of digitization is outputted to an addition circuit 1303 as a signal 1302s. The threshold value Vsl th is added to a first reference value Vref1 and a second reference value Vref2 after selection. Due to such a constitution, it becomes possible to make the first reference value Vref1 and the second reference value Vref2 of FIG. 10 follow the displacement of the symmetry of the input signal of the adaptive equalizer circuit and hence, the stable equalization characteristics can be ensured.

Although the adaptive equalizer circuit which uses the second reference value is described in this embodiment, the constitution which controls the sign of the reference value as described in the embodiment 3 may be used.

Figure 14:
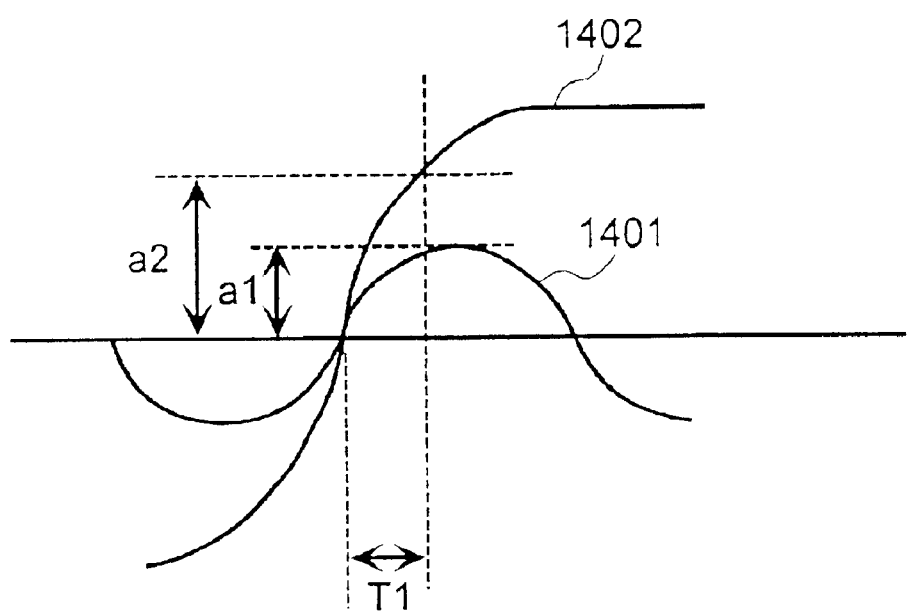
FIG. 14 is a view showing waveforms having maximum amplitude and a minimum amplitude in an eye pattern of an equalizer circuit output.

FIG. 14 is a view showing eye patterns having the minimum amplitude and the maximum amplitude which are extracted from the eye patterns of the equalizer circuit output signals. For example, assuming that the drawing depicts regenerating signals of a DVD-ROM disc, numeral 1401 indicates a 3 T-cycle signal and numeral 1402 indicates a 14 T-cycle signal. When the coefficient updating of an equalizer circuit is performed to this waveform with a timing of T1 after the zero-crossing, the amplitude at this timing becomes a1 at the waveform 1401 and a2 at the waveform 1402. The coefficient updating is performed based on the difference between respective amplitudes and the reference value Vref. Assuming that the reference value Vref is properly set, the greater the amplitude ratio b=(a2−a1)/a2, the difference between the respective amplitudes and the reference value at the time of performing the coefficient updating of the equalizer circuit becomes larger, while the smaller the amplitude b, the difference becomes smaller. The allowable value of the amplitude ratio b is determined based on an allowable value of the equalization error which can be computed based on a gain of a loop, a jitter of the equalization waveform and the like for performing the coefficient updating of the equalizer circuit.

Accordingly, although the timing T1 of the coefficient updating is set to the ½ clock cycle in the embodiment 1, the timing T1 may be arbitrarily selected within a range of allowable value of the above-mentioned amplitude ratio b. Further, although an example which performs the coefficient updating only at the timing after the zero-crossing is shown in FIG. 14, even in the technique which performs the coefficient updating at the timing before and after the zero-crossing as in the case of the embodiments 2–5, the amplitude ratio b can be similarly defined and the timing for performing the coefficient updating may be arbitrarily selected within a range of allowable value of this amplitude ratio b. Here, by performing the coefficient updating at the timing of an equal interval before and after the zero-crossing, an advantageous effect similar to that of the embodiment 3 can be obtained.

Further, the updating means of the equalization characteristics according to the present invention is not limited to the above-mentioned embodiments. Further, although the digital circuit operation in which respective circuit elements are operated based on the timing signals DCLK is described in the above-mentioned embodiments, the equalizer circuit may be constituted by an analogue circuit and a sample hold circuit which is operated based on the timing signals DCLK used in the above-mentioned embodiments may be provided to inputs of a subtraction circuit for computing the equalization error and a coefficient control circuit.

According to the adaptive equalizer circuit of the present invention, the equalization characteristics of the adaptive equalizer circuit are updated using the equalization error computed based on the adaptive equalizer circuit output which is obtained in synchronization with the reference clock signal of the input signal obtained from the transmission system after the zero-crossing by the ½ clock cycle or before and after the zero-crossing by the ½ clock cycle and the reference value which is arbitrarily given. Accordingly, in the system in which the amplitude is fluctuated, the stable adaptive equalization operation can be realized without changing over the reference value for computing the equalization error based on the amplitude. Further, by interlocking the reference value with the threshold value of the binarization circuit which constitutes the rear stage of the equalizer circuit, the equalization characteristics which exhibit the stability to the displacement of the symmetry of the input signal can be realized.

We claim:

1. An adaptive equalizer circuit which adds given equalization characteristics to signals input through a transmission path and performs a control such that an equalization error obtained by performing an arithmetic operation based on an obtained output and a given reference value is minimized thus obtaining equalization characteristics, an improvement being characterized in that the adaptive equalizer circuit changes the equalization characteristics wherein the arithmetic operation of the adaptive equalizer circuit is performed in synchronization with a signal having a phase different from a reference clock signal of the signal by a ½ clock cycle, the synchronization is realized by sampling data at the point of ½ clock cycle different from a zero-crossing point of the signal, and the equalization characteristics are changed by computing the equalization error based on a first output value and said given reference value after a sign of an output of the adaptive equalizer circuit is changed from positive to negative or from negative to positive.

2. An adaptive equalizer circuit according to claim 1, wherein the equalization characteristics of the adaptive equalizer circuit are changed based on the first output value and a first reference value after the sign of the output of the adaptive equalizer circuit is changed from positive to negative, and the equalization characteristics are changed based on the first output and a second reference value after the sign of the output of the adaptive equalizer circuit is changed from negative to positive.

3. An adaptive equalizer circuit according to claim 2, wherein in addition to the change operation of the equalization characteristics of the adaptive equalizer circuit, the adaptive equalizer circuit changes the equalization characteristics of the adaptive equalizer circuit based on the second reference value and the output value immediately before the sign of the output of the adaptive equalizer circuit is changed from positive to negative, and the equalization characteristics are changed based on the first reference value and the output value immediately before the sign of the output of the adaptive equalizer circuit is changed from negative to positive.

4. An adaptive equalizer circuit according to claim 1, wherein equalization characteristics of the adaptive equalizer circuit are changed based on the first output value and a first reference value after the sign of the an output of the adaptive equalizer circuit is changed from positive to negative or from negative to positive, and the equalization characteristics are changed based on a second reference value and the output value immediately before the sign of the output of the adaptive equalizer circuit is changed from positive to negative or from negative to positive.

5. An adaptive equalizer circuit according to claim 2, wherein the second reference value is set to a value which inverts the sign of the first reference value.

6. An adaptive equalizer circuit according to claim 1, wherein the adaptive equalizer circuit is operated to sample an input signal with a signal having a phase different from the reference clock signal which is in synchronization with the input signal by a ½ clock cycle, and the equalization characteristics is changed based on the output value of the adaptive equalizer circuit.

7. An adaptive equalizer circuit which adds given equalization characteristics to signals input through a transmission path and performs a control such that an equalization error obtained by performing an arithmetic operation based on an obtained output and a given reference value is minimized thus obtaining equalization characteristics, an improvement being characterized in that the adaptive equalizer circuit changes the equalization characteristics wherein the arithmetic operation of the adaptive equalizer circuit is performed in synchronization with a signal having a phase different from a reference clock signal of the signal by a ½ clock cycle, and the equalization characteristics are changed by computing the equalization error based on a first output value and said given reference value after a sign of an output of the adaptive equalizer circuit is changed from positive to negative or from negative to positive, wherein the reference value is changed corresponding to the change of threshold values at the time digitizing the output of the adaptive equalizer circuit.

8. An adaptive equalizer circuit according to claim 1, wherein the signals inputted to the adaptive equalizer circuit are signals optically read from a recording medium.

* * * * *